(12) United States Patent
Shioji (10) Patent No.: US 10,249,804 B2
(45) Date of Patent: *Apr. 2, 2019

(54) SEMICONDUCTOR DEVICE, BASE, AND METHOD FOR MANUFACTURING SAME

(71) Applicant: NICHIA CORPORATION, Anan-shi, Tokushima (JP)

(72) Inventor: Shuji Shioji, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/651,679

(22) Filed: Jul. 17, 2017

(65) Prior Publication Data

US 2018/0026169 A1  Jan. 25, 2018

(30) Foreign Application Priority Data

Jul. 19, 2016  (JP) ................. 2016-141600

(51) Int. Cl.

| H01L 33/00 | (2010.01) |
| H01L 33/60 | (2010.01) |
| C23C 14/08 | (2006.01) |
| C23C 14/10 | (2006.01) |
| C23C 14/16 | (2006.01) |
| C23C 14/24 | (2006.01) |
| C23C 14/34 | (2006.01) |
| C25D 9/04 | (2006.01) |
| G02B 5/08 | (2006.01) |
| H01L 33/48 | (2010.01) |

(Continued)

(52) U.S. Cl.
CPC ............ *H01L 33/60* (2013.01); *C23C 14/083* (2013.01); *C23C 14/10* (2013.01); *C23C 14/165* (2013.01); *C23C 14/24* (2013.01); *C23C 14/3464* (2013.01); *C25D 9/04* (2013.01); *G02B 5/0816* (2013.01); *H01L 33/486* (2013.01); *C23C 18/42* (2013.01); *C25D 7/12* (2013.01); *H01L 2933/0058* (2013.01)

(58) Field of Classification Search
USPC ...... 257/81, 82, 98–100, 116, 117, 432–437, 257/749, E33.056–E33.059, E25.032, 257/457, 459; 438/25–28
See application file for complete search history.

(56) References Cited

U.S. PATENT DOCUMENTS

| 5,226,053 A | 7/1993 | Cho et al. |
| 2001/0028062 A1 | 10/2001 | Uemura et al. |
| 2004/0087050 A1 | 5/2004 | Uemura et al. |

(Continued)

FOREIGN PATENT DOCUMENTS

| JP | H05-275739 A | 10/1993 |
| JP | 2001-035814 A | 2/2001 |

(Continued)

*Primary Examiner* — Niki H Nguyen
(74) *Attorney, Agent, or Firm* — Foley & Lardner LLP (57) ABSTRACT

A semiconductor device includes a base and a semiconductor element disposed on the base. The base includes: a base member, a reflective film located above the base member, the reflective film containing silver as a major component and containing particles formed of at least one material selected from the group consisting of an oxide, a nitride, and a carbide; and a dielectric multilayered film located above the reflective film.

24 Claims, 7 Drawing Sheets

(51) Int. Cl.
*C25D 7/12* (2006.01)
*C23C 18/42* (2006.01)

(56) References Cited

U.S. PATENT DOCUMENTS

| | | |
|---|---|---|
| 2005/0199895 A1 | 9/2005 | Seong et al. |
| 2006/0231800 A1 | 10/2006 | Wang et al. |
| 2006/0231801 A1 | 10/2006 | Carroll et al. |
| 2007/0001183 A1 | 1/2007 | Chen |
| 2008/0254567 A1 | 10/2008 | Konno |
| 2008/0258174 A1 | 10/2008 | Seong |
| 2010/0127369 A1 | 5/2010 | Seki et al. |
| 2010/0190298 A1 | 7/2010 | Kuramoto et al. |
| 2013/0058102 A1 | 3/2013 | Lin |
| 2013/0070452 A1 | 3/2013 | Urano et al. |
| 2014/0159090 A1* | 6/2014 | Huang .................... H01L 33/02 257/98 |
| 2014/0203318 A1 | 7/2014 | Matsui et al. |
| 2014/0342104 A1 | 11/2014 | Tauchi et al. |
| 2015/0155456 A1 | 6/2015 | Kuramoto et al. |
| 2015/0179537 A1* | 6/2015 | Shioji .................... H01L 33/46 257/773 |
| 2015/0255419 A1 | 9/2015 | Nishimoto et al. |
| 2016/0247988 A1 | 8/2016 | Shioji et al. |

FOREIGN PATENT DOCUMENTS

| | | |
|---|---|---|
| JP | 2001-210845 A | 8/2001 |
| JP | 2001-284642 A | 10/2001 |
| JP | 2001-332762 A | 11/2001 |
| JP | 3346735 B2 | 11/2002 |
| JP | 2003-163373 A | 6/2003 |
| JP | 2005-072148 A | 3/2005 |
| JP | 2005-197289 A | 7/2005 |
| JP | 2005-311272 A | 11/2005 |
| JP | 2005-325386 A | 11/2005 |
| JP | 2006-108161 A | 4/2006 |
| JP | 2006-120913 A | 5/2006 |
| JP | 2006-165326 A | 6/2006 |
| JP | 2006-165467 A | 6/2006 |
| JP | 2006-302890 A | 11/2006 |
| JP | 2006-302891 A | 11/2006 |
| JP | 2006-332032 A | 12/2006 |
| JP | 2007-013093 A | 1/2007 |
| JP | 2007-243074 A | 9/2007 |
| JP | 2007-273975 A | 10/2007 |
| JP | 2008-186946 A | 8/2008 |
| JP | 2008-251685 A | 10/2008 |
| JP | 2009-519608 A | 5/2009 |
| JP | 2009-267040 A | 11/2009 |
| JP | 4362170 B2 | 11/2009 |
| JP | 2010-153825 A | 7/2010 |
| JP | 2010-524257 A | 7/2010 |
| JP | 2011-035275 A | 2/2011 |
| JP | 2011-222603 A | 11/2011 |
| JP | 2011-233555 A | 11/2011 |
| JP | 2012-062564 A | 3/2012 |
| JP | 2013-065856 A | 4/2013 |
| JP | 2013-125883 A | 6/2013 |
| JP | 2013-149616 A | 8/2013 |
| JP | 2013-149911 A | 8/2013 |
| JP | 2013-151735 A | 8/2013 |
| JP | 5470673 B2 | 4/2014 |
| JP | 2014-139997 A | 7/2014 |
| JP | 2014-524674 A | 9/2014 |
| JP | 5664625 B2 | 2/2015 |
| JP | 2015-106642 A | 6/2015 |
| JP | 2015-144245 A | 8/2015 |
| WO | WO-2010/084746 A1 | 7/2010 |
| WO | WO-2011/136236 A1 | 11/2011 |

* cited by examiner

SEMICONDUCTOR DEVICE, BASE, AND METHOD FOR MANUFACTURING SAME

CROSS-REFERENCE TO RELATED APPLICATIONS

The present application claims priority under 35 U.S.C. § 119 to Japanese Patent Application No. 2016-141600, filed Jul. 19, 2016, the contents of which are hereby incorporated by reference in their entirety.

BACKGROUND

The present disclosure relates to a semiconductor device, a base, and a method for manufacturing the semiconductor device and the base.

The use of light emitting devices using semiconductor light emitting elements such as LED's has expanded, and there is an increasing demand for improved emission efficiency. Such a light emitting device is generally configured such that a semiconductor light emitting element is housed in a resin case supporting lead frames and is sealed with a resin. Each of the lead frames has an upper surface on which a silver film serving as a reflective film is formed for the purposes of efficient reflection. Silver has a high reflectance. However, reflection of light involves absorption of light by a few percent. Furthermore, multiple reflections occur in the resin case, resulting in an increase in the amount of light absorption.

As an example of a method for improving emission efficiency, Japanese Patent Publication No. 2008-186946 discloses a light emitting semiconductor device comprising an enclosure having a recess and a light reflecting member disposed in the recess, wherein the light reflecting member is a stacked sheet constituted by a resin film and a plurality of dielectric films having different refractive indices and stacked on one surface of the resin film.

Japanese Patent Publication No. 2011-233555 discloses a light emitting element supporting member provided with a light shielding layer constituted by a base member and a reflector disposed on the base member, wherein the reflector is composed of a metal and one or more dielectric layers stacked on the metal.

SUMMARY

According to one aspect of the present disclosure, a semiconductor device includes a base and a semiconductor element disposed on the base. The base includes: a base member; a reflective film located above the base member, the reflective film containing silver as a major component and containing particles formed of at least one material selected from the group consisting of an oxide, a nitride, and a carbide; and a dielectric multilayered film located above the reflective film.

According to another aspect of the present disclosure, a base includes: a base member; a reflective film located above the base member, the reflective film containing silver as a major component and containing particles formed of at least one material selected from the group consisting of an oxide, a nitride, and a carbide; and a dielectric multilayered film located above the reflective film.

According to further aspect of the present disclosure, a method for manufacturing a semiconductor device includes forming a base; and mounting a semiconductor element on the base. The forming the base includes: forming a reflective film on a base member, the reflective film containing silver as a major component and containing particles formed of at least one material selected from the group consisting of an oxide, a nitride, and a carbide; and forming a dielectric multilayered film on the reflective film.

According to further aspect of the present disclosure, a method for manufacturing a base includes: forming a reflective film on a base member, the reflective film containing silver as a major component and containing particles formed of at least one material selected from the group consisting of an oxide, a nitride, and a carbide; and forming a dielectric multilayered film on the reflective film.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DESCRIPTION OF EMBODIMENTS

Embodiments of the invention are described below with reference to the accompanying drawings. It should be appreciated, however, that the embodiments described below are merely exemplary, and the present invention is not limited to the described embodiments. Unless otherwise specified, any dimensions, materials, shapes, relative arrangements and the like of the constituent members described in the embodiments are given as examples for illustration, and are not intended to be limiting. Furthermore, the sizes, positional relations, and so forth of the constituent members shown in the drawings may be exaggerated for the sake of clarity. In the following description, members that are the same or analogous are given the same name or number, and duplicative detailed descriptions are appropriately omitted.

Base and Semiconductor Device

First, a description is given of a base and a semiconductor device according to the present embodiment. The semiconductor device according to the present embodiment is a semiconductor light emitting device (hereinafter referred to as light emitting device) using a semiconductor light emitting element (hereinafter referred to as light emitting element) as a semiconductor element.

Figure 1A:
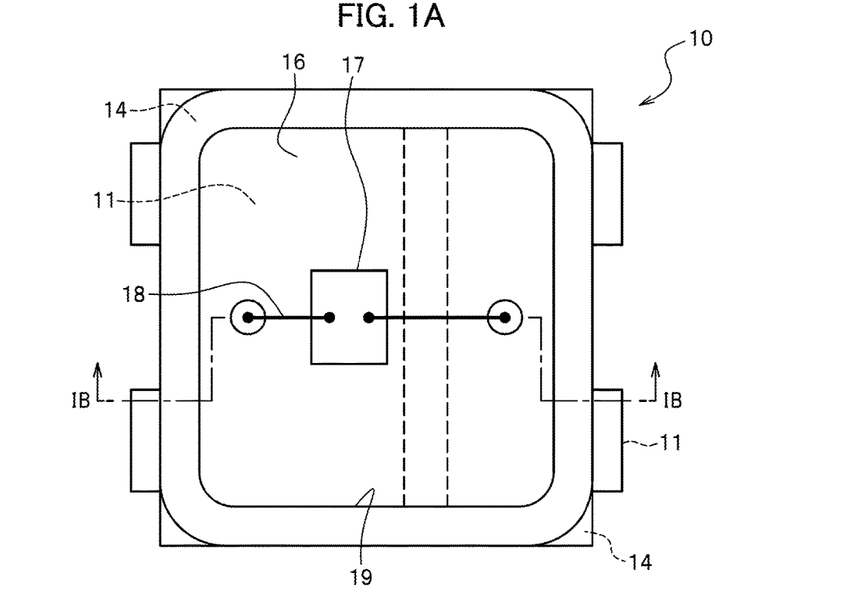
FIG. 1A is a schematic plan view of a light emitting device according to an embodiment of the present disclosure.
Figure 1B:
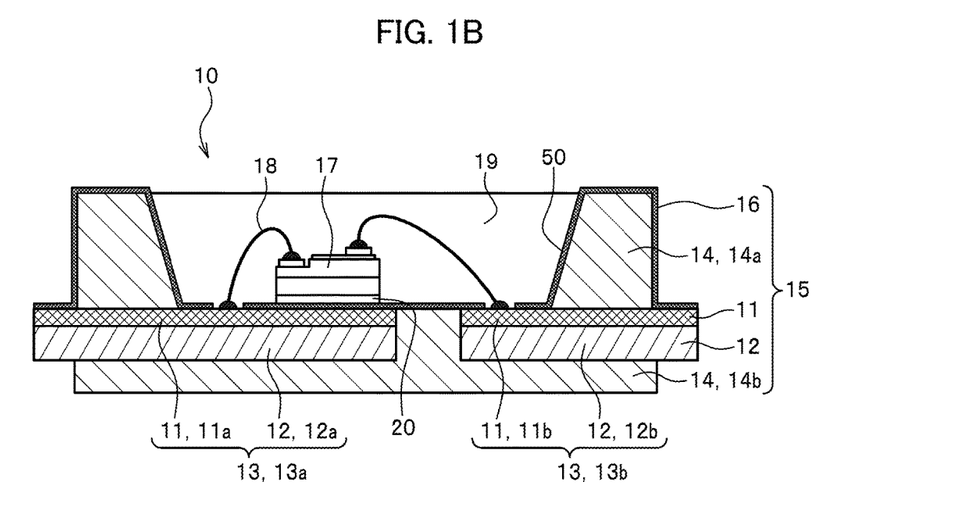
FIG. 1B is a schematic cross-sectional view of the light emitting device according to the embodiment, taken along line IB-IB in FIG. 1A.
Figure 2A:
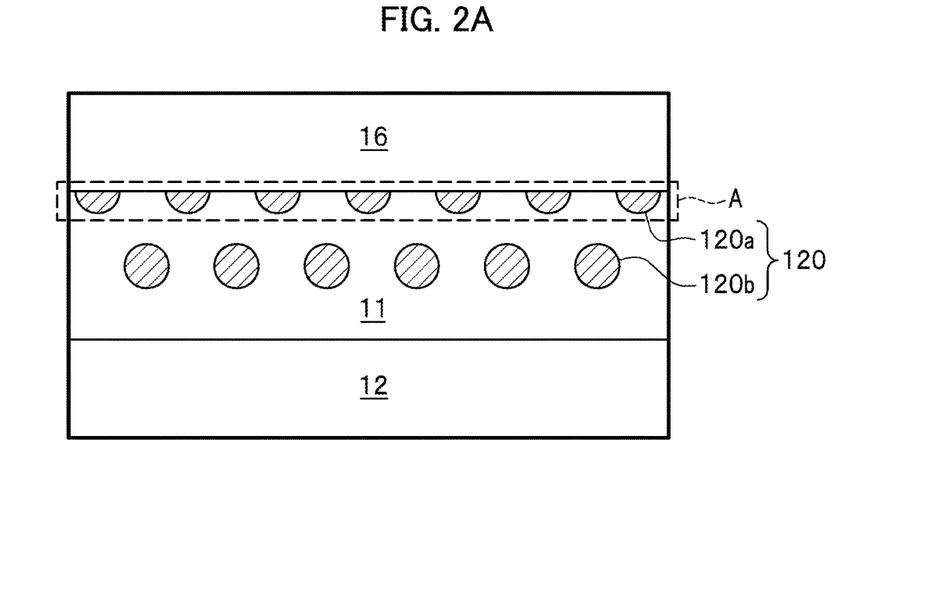
FIG. 2A is a schematic cross-sectional view of the light emitting device according to the embodiment, showing the configuration of an interface between a reflective film and a dielectric multilayered film of the light emitting device and a state of oxide in the reflective film.
Figure 2B:
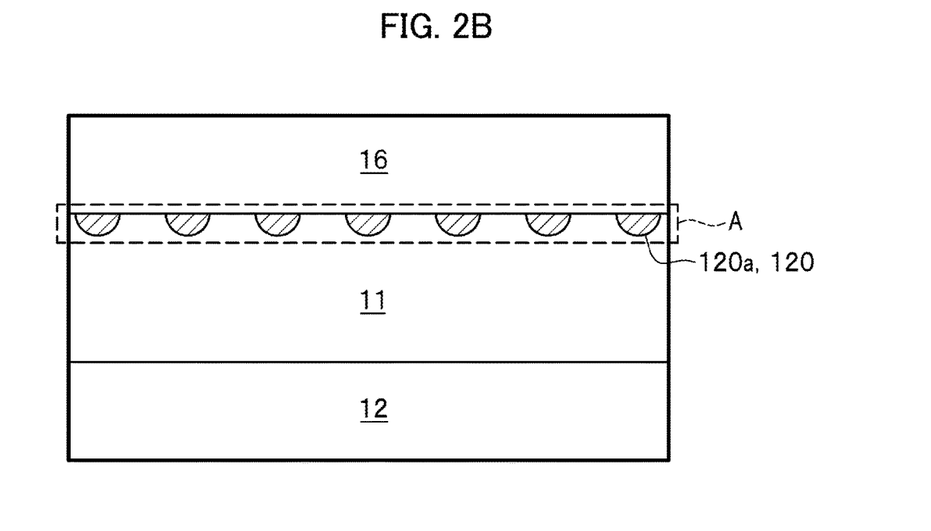
FIG. 2B is a schematic cross-sectional view of the light emitting device according to the embodiment, showing the configuration of the interface between the reflective film and the dielectric multilayered film of the light emitting device and another state of the oxide in the reflective film.
Figure 3A:
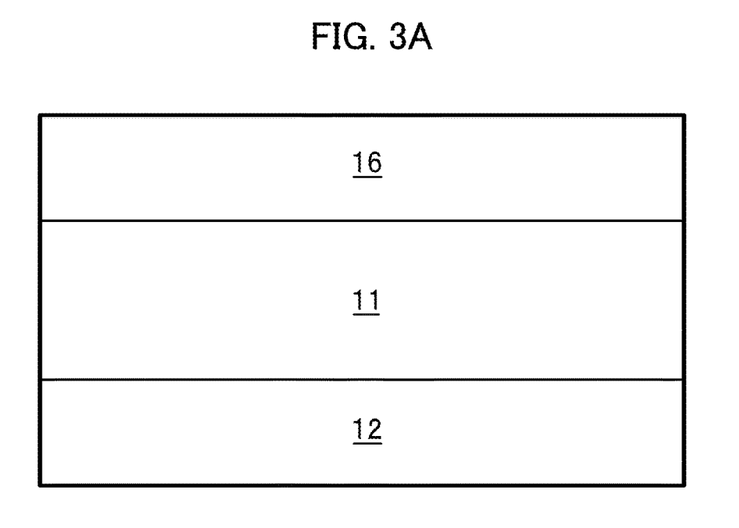
FIG. 3A is a schematic cross-sectional view of a light emitting device according to a reference example, showing the configuration of an interface between a reflective film and a dielectric multilayered film of the light emitting device.
Figure 3B:
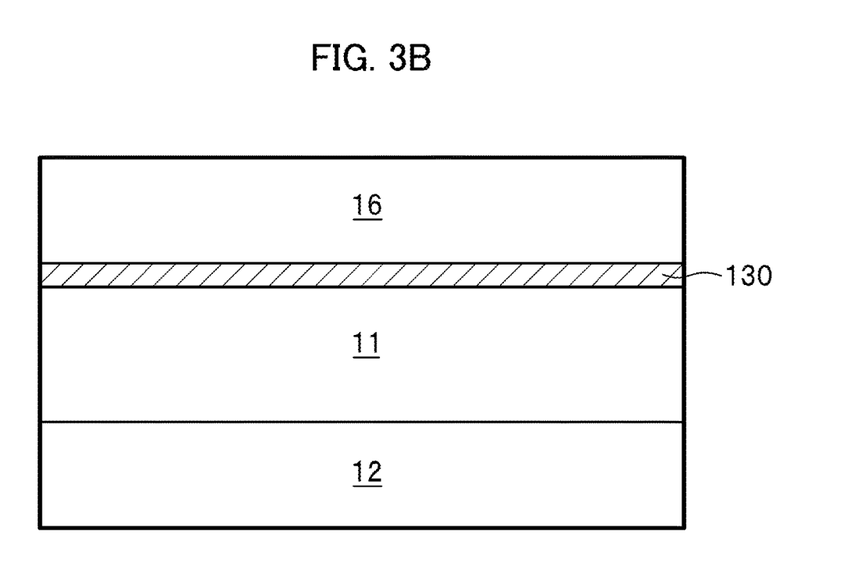
FIG. 3B is a schematic cross-sectional view of a light emitting device according to another reference example, showing the configuration of an interface between a reflective film and a dielectric multilayered film of the light emitting device and a state of layered oxide disposed at the interface.

FIG. 1A is a schematic plan view of a light emitting device according to one embodiment. FIG. 1B is a schematic cross-sectional view of the light emitting device according to the embodiment, taken along line IB-IB in FIG. 1A. FIGS. 2A and 2B are each a schematic cross-sectional view of the light emitting device according to the embodiment, showing the configuration of an interface between a reflective film and a dielectric multilayered film of the light emitting device and a state of oxide in the reflective film. FIG. 3A is a schematic cross-sectional view of a light emitting device according to a reference example, showing a configuration of an interface between a reflective film and a dielectric multilayered film of the light emitting device. FIG. 3B is a schematic cross-sectional view of a light emitting device according to another reference example, showing a configuration in which an oxide layer is disposed at an interface between a reflective film and a dielectric multilayered film of the light emitting device. Note that each of FIGS. 2A and 2B schematically illustrates the state of the oxide in the reflective film for ease of understanding.

A light emitting device 10 has a base 15, a light emitting element 17, wires 18, and a light-transmissive member 19.

The base 15 has a recess (cavity) 50 for housing the light emitting element 17, and is formed in a cup shape. In the base 15, conductive members 13 (13a, 13b) and a resin mold bodies 14 (14a, 14b) are integrally formed such that the base 15 includes the recess 50. The base 15 has: conductive members 13 each having a reflective film 11 and a base member 12; resin mold bodies 14; and a dielectric multilayered film 16. Hereinafter, a description is given of each member.

Conductive Members

The conductive members 13 are a pair of conductive members 13a and 13b. The conductive member 13a has a base member 12a and a reflective film 11a formed on the base member 12a. The conductive member 13b has a base member 12b and a reflective film 11b formed on the base member 12b. The conductive members 13a and 13b have protruding portions that each extend out past a side wall of the resin mold bodies 14 in a rectangular shape in plan view, as external terminals. The conductive members 13a and 13b are disposed spaced apart from each other and constitute parts of a bottom portion of the recess 50 and parts of a bottom portion of the base 15.

Base Member

Each of the base members 12 may be a member having a lead frame or a substrate with wiring patterns (wiring substrate). The base members 12 may each be a lead frame made of a metal such as copper, aluminum, gold, silver, tungsten, iron, nickel, cobalt, molybdenum, alloy containing any of the foregoing metals, a single layer of phosphor bronze or iron-containing copper, or a multilayer stack of the foregoing materials.

The base members 12 may each be a wiring substrate composed of materials such as ceramics, metals, and resins (including fiber-reinforced resin). Examples of the materials for the ceramic substrate include alumina and aluminum nitride. Examples of the materials for the metal substrate include aluminum and copper. Examples of the materials for the resin substrate include glass epoxy, BT resin, and polyimide. The wiring substrate may be rigid or flexible. The wiring pattern of the wiring substrate may be formed of a single layer of a material such as copper, nickel, palladium, rhodium, tungsten, chromium, titanium, aluminum, silver, gold, or alloy containing any of the foregoing materials, or may be formed of a multilayer stack of the foregoing materials.

Reflective Film

The reflective films 11 reflect light that has passed through the dielectric multilayered film 16. The reflective films 11 also serve as electrodes through which a current is provided from outside to the light emitting device 10. The reflective films 11 constitute surfaces of the conductive members 13.

Each of the reflective films 11 is a silver alloy layer containing silver (Ag) as a major component and containing an oxide 120. The oxide 120 is dispersed substantially evenly throughout the reflective film 11.

As shown in FIG. 2A, because each of the reflective films 11 contains the oxide 120, a pseudo transition layer, in which the oxide 120 and silver in the reflective film 11 coexist, is formed in the reflective film 11 at an interface between the reflective film 11 and the dielectric multilayered film 16. Such a pseudo transition layer increases the adhesion between the reflective films 11 and the dielectric multilayered film 16 and thus increases the reliability of the light emitting device 10. Note that, in FIGS. 2A and 2B, the reference letter A schematically indicates the pseudo transition layer. The transition layer is a silver alloy layer composed of silver and the oxide 120. The reference letter A refers to this transition layer as a whole.

That is, part of the oxide 120 is in contact with the dielectric multilayered film 16 or is distributed near a surface of the reflective film 11 closer to the dielectric multilayered film 16. Note that the wording "distributed near a surface of the reflective film 11 closer to the dielectric multilayered film 16" means that the oxide 120 is not contact with the dielectric multilayered film 16 but is distributed so near the dielectric multilayered film 16 that the distribution of the oxide 120 constitutes a pseudo transition layer that causes the same effect as that caused by an oxide 120 being partially in contact with the dielectric multilayered film 16 at the interface between the reflective films 11 and the dielectric multilayered film 16. Specifically, in such a case, the oxide 120 is distributed such that particles of the oxide 120 closest to the interface between the reflective films 11 and the dielectric multilayered film 16 are located at a depth of at most 20 nm below the interface, for example.

The light emitting device 10 has high adhesion between the reflective films 11 and the dielectric multilayered film 16. Thus, peeling-off is not likely to occur in the dielectric multilayered film 16. For this reason, the light emitting device 10 does not need to have an adhesion layer between the reflective films 11 and the dielectric multilayered film 16, and thus does not suffer from light absorption caused by the adhesion layer.

In addition, in the light emitting device 10, the dielectric multilayered film 16 is formed on the reflective films 11 that constitute surfaces of the respective conductive members 13. This structure makes it possible to improve the light emission efficiency by the reflective films 11 and the dielectric multilayered film 16.

As described above, the oxide 120 and silver in each of the reflective films 11 coexist in the reflective film 11 at the interface between the reflective film 11 and the dielectric multilayered film 16. This means that part of the oxide 120 is present at the interface and is in contact with the dielectric multilayered film 16 together with silver, or part of the oxide 120 is distributed near the surface of the reflective film 11 closer to the dielectric multilayered film 16. The pseudo transition layer is not an actual layer and rather means a kind of layer produced by the presence of the oxide 120 and silver at the interface.

The presence of the oxide 120 in the reflective films 11 causes the reflective films 11 to exhibit a pinning effect, which suppresses crystal grains of silver, a major component of the reflective films 11, from growing. This suppresses the growth of crystal grains due to the thermal history in the assembly process of the semiconductor device, so that the smoothness of the surface of the reflective films 11 is kept and occurring of voids in the reflective films 11 is suppressed. This enables the reflective films 11 to maintain high reflectance and good heat dissipation properties.

Note that, in FIG. 2A, the oxide 120b denotes the oxide 120 dispersed throughout each of the reflective films 11 in granular form and the oxide 120a denotes the oxide 120 attached to the interface between the reflective film 11 and the dielectric multilayered film 16. Here, when the oxide 120a is attached to the interface between the reflective film 11 and the dielectric multilayered film 16, the oxide 120a should not constitute a layer by itself; rather part of the silver should be in contact with the dielectric multilayered film 16. Note, however, that the oxide 120a may be continuously distributed in a mesh form as long as part of silver is in contact with the dielectric multilayered film 16. Note that, when the amount of the oxide 120 added to the reflective film 11 is small, the amount of the oxide 120a attached to the interface or distributed at or near the interface is small, and it is likely that the pseudo transition layer is formed such that the oxide 120a is distributed as islands in the pseudo transition layer. Here, the wording "distributed as islands" means that the oxide 120a is not continuously distributed but rather discretely distributed. Even in this case, however, it can be said that the oxide 120a and silver coexist and thus constitute a pseudo transition layer.

Preferably, the oxide 120 in the reflective films 11 is at least one substance selected from $SiO_2$, $Al_2O_3$, $ZrO_2$, $TiO_2$, ZnO, $Ga_2O_3$, $Ta_2O_5$, $Nb_2O_5$, $In_2O_3$, $SnO_2$, NiO, and $HfO_2$. More preferably, the oxide 120 in the reflective films 11 is at least one substance selected from $Ga_2O_3$, $Nb_2O_5$, and $HfO_2$, in view of the adhesion between the reflective films 11 and the dielectric multilayered film 16. The use of the oxide as described above can improve the adhesion between the reflective films 11 and the dielectric multilayered film 16.

In the embodiment shown in FIG. 2A, the oxide 120 is dispersed throughout the reflective films 11 in granular form. However, the oxide 120 may be not necessarily dispersed throughout the reflective films 11 in granular form, but rather unevenly distributed such that the distribution of the oxide 120 is concentrated at or near a surface of the reflective film closer to the dielectric multilayered film 16, as shown in FIG. 2B. That is, the oxide 120 may be only distributed on the surface of the reflective film 11 closer to the dielectric multilayered film 16 so as to be in contact therewith, or may be only distributed near that surface.

Note that even when the oxide 120 is dispersed throughout the reflective film 11, the oxide 120 may be unevenly distributed such that the distribution of the oxide 120 is concentrated at or near the surface of the reflective film closer to the dielectric multilayered film 16. Even when the oxide 120 is unevenly distributed such that the distribution of the oxide 120 is concentrated at or near the surface of the reflective film closer to the dielectric multilayered film 16, it is possible to obtain the same effect as when the oxide 120 is substantially evenly dispersed throughout the reflective film 11.

Note that the effects of the base 15 and the light emitting device 10 according to the present embodiment are not obtained either with a configuration in which the reflective film 11 is a pure silver film not containing an oxide as shown in FIG. 3A, or with a configuration in which an oxide layer 130 composed of an oxide only is disposed as shown in FIG. 3B.

Preferably, the content of the oxide 120 in the reflective film 11a is greater than 0.01% by mass with respect to the total mass of the reflective film 11a; and the content of the oxide 120 in the reflective film 11b is greater than 0.01% by mass with respect to the total mass of the reflective film 11b.

The oxide 120 having a content greater than 0.01% by mass increases the adhesion between the reflective films 11 and the dielectric multilayered film 16. In view of the adhesion between the reflective films 11 and the dielectric multilayered film 16, the content of the oxide 120 in the reflective films 11 is more preferably at least 0.02% by mass, and still more preferably at least 0.03% by mass. In addition, in view of the reflectance (initial reflectance) of the reflective films 11, the content of the oxide 120 in the reflective films 11 is preferably at most 5% by mass, more preferably at most 4% by mass, and still more preferably at most 2.5% by mass.

Note that, the higher the transparency of the oxide 120 contained in the reflective films 11, the higher the reflectance of the reflective films 11. Thus, the higher the transparency of the oxide 120, the more the content of the oxide 120 in the reflective film 11 may be.

The content of the oxide 120 in the reflective film 11 can be determined by inductively coupled plasma atomic emission spectrometry (ICP-AES) and the like.

The reflective films 11 can be formed for example by electroplating, electroless plating, sputtering, or vapor deposition. The reflective films 11 may have a desired thickness of, for example, at least 0.02 μm and at most 5.0 μm, or preferably at least 0.05 μm and at most 3.0 μm.

Dielectric Multilayered Film

The dielectric multilayered film 16 is a kind of distributed Bragg reflector (DBR) film in which a plurality of pairs of low refractive index dielectric film and high refractive index dielectric film are stacked to selectively reflect light having a predetermined wavelength. Specifically, the dielectric multilayered film 16 is a distributed Bragg reflector (DBR) film in which two or more kinds of films each having a different refractive index and a thickness of ¼n times a predetermined wavelength of light, where n denotes the refractive index. The dielectric multilayered film 16 is able to efficiently reflect light having the predetermined wavelength.

The dielectric multilayered film 16 is disposed on the bottom and side surfaces of the recess 50 and on a surface of the resin mold body 14a. Specifically, the dielectric multilayered film 16 is disposed on the conductive members 13 except parts thereof to which wires 18 are to be bonded, and is disposed on the entire surface of the resin mold body 14a, which is disposed on the conductive members 13.

Preferably, the material for the dielectric multilayered film 16 is an oxide of at least one element selected from Si, Ti, Zr, Nb, Ta, and Al or a nitride of at least one element selected from Si, Ti, Zr, Nb, Ta, and Al. The dielectric multilayered film 16 preferably contains this oxide or nitride as a major component.

Note that meaning of the phrase "contains . . . as a major component" stated above is that the dielectric multilayered film 16 may contain the oxide or nitride only, or may contain, in addition to the oxide or nitride, minute amounts of impurities or other minute amounts of elements, to such an extent that the effects of the embodiment are not impaired.

Resin Mold Body

The resin mold body 14a constitutes side walls of the base 15. The resin mold body 14b has a portion disposed between the conductive members 13a and 13b to fix parts thereof, and has portions disposed underneath and in contact with lower surfaces of the conductive members 13a and 13b. The resin mold body 14b and the conductive members 13 together constitute a bottom portion of the base 15. The resin mold bodies 14a and 14b serve as a base for forming the base 15 in a cup shape in conjunction with the conductive members 13. The resin mold bodies 14a and 14b may be formed as separate members or may be formed as a single member. Even when the resin mold bodies 14a and 14b are formed as a single member, they are not necessarily formed at the same time. One of the resin mold bodies 14a and 14b may be formed and then the other may be formed later. For example, it is possible to form the base members 12 and the resin mold body 14b, then form the reflective films 11, and then form the resin mold body 14a.

The resin mold bodies 14 may be formed with a thermoplastic resin, a thermosetting resin, a modified resin of one of the foregoing resins or a hybrid resin containing at least one type of the foregoing resins. Examples of the thermoplastic resin includes a polyamide resin, a polyphthalamide resin, a polycarbonate resin, a polyphenylene sulfide resin, an ABS resin, an acrylic resin, a polybutylene terephthalate resin, a polyethylene terephthalate resin, a polycyclohexane terephthalate resin, and a liquid crystal polymer. Examples of the thermosetting resin includes an epoxy resin, a silicone resin, a urea resin, a phenolic resin, a BT resin, a polyimide resin, and a polyurethane resin. Those base materials may contain materials known in the art, such as a coloring agent, a filler, a reinforced fiver, a later-described fluorescent substance, and the like. In particular, the coloring agent is preferably a material having good reflectance, for example one having a white color, such as titanium oxide and zinc oxide. Examples of the filler include silica and alumina. Examples of the reinforced fiver include glass, calcium silicate, and potassium titanate.

Light Emitting Element

The light emitting element 17 is bonded via an adhesive 20 to a portion of the dielectric multilayered film 16 that is disposed on one of the reflective films 11 constituting parts of the bottom surface of the recess 50. The light emitting element 17 has an upper surface side on which a pair of positive and negative electrodes are provided. Each of the pair of positive and negative electrodes is electrically connected through a wire 18 to corresponding one of the reflective films 11a and 11b.

The light emitting element 17 may be a semiconductor light emitting element such as an LED element. The light emitting element 17 may be any structural element composed of various semiconductors and having a pair of positive and negative electrodes. It is particularly preferred that the light emitting element is made of a nitride semiconductor ($In_xAl_yGa_{1-x-y}N$, $0 \leq x$, $0 \leq y$, $x+y \leq 1$) that is able to effectively excite a phosphor. Alternatively, the light emitting element may be made of a gallium-arsenic or gallium-phosphorus semiconductor.

Adhesive

The adhesive 20 is a member for attaching the light emitting element 17 to the dielectric multilayered film 16. The adhesive 20 may be an electrically insulative adhesive, examples of which include an epoxy resin, a silicone resin, and a modified or hybrid resin of the foregoing. Alternatively, the adhesive 20 may be an electrically conductive adhesive, examples of which include: electrically conductive paste of silver, gold, palladium or the like; a solder such as a tin-bismuth based solder, a tin-copper based solder, a tin-silver based solder, or a gold-tin based solder; or a brazing filler metal such as a metal having a low melting-point.

Wire

The wires 18 are conductive leads connecting the electrodes of the light emitting element 17 and the reflective films 11. Wires 18 may be metal wires made of gold, copper, silver, platinum, aluminum, or an alloy of the foregoing. Gold wires are particularly preferred since they are less breakable by the stress from the light-transmissive member 19 and have good heat resistance. The wires 18 may be coated with silver to increase the light reflectance.

Light-Transmissive Member

The light-transmissive member 19 is disposed in the recess 50 of the base 15. The light-transmissive member 19 is in contact with the dielectric multilayered film 16 of the base 15. The light-transmissive member 19 covers the light emitting element 17. Specifically, it is preferred that the light-transmissive member 19 be disposed so as to be in contact with the substantially entire upper surface of the light emitting element 17 (preferably including wire connecting portions when wires are present) and more preferably be in contact also with the side surfaces of the light emitting element 17.

As used herein, the term "light-transmissive" means a property of transmitting approximately 70% or more, preferably approximately 80% or more, more preferably approximately 90% or more, and still more preferably approximately 95% or more of the light emitted from the light emitting element 17.

Preferably, the light-transmissive member 19 is made of a light-transmissive resin. Examples of such a light-transmissive resin include a polycarbonate resin, an epoxy resin, a phenolic resin, a silicone resin, an acrylic resin, a TPX resin, a polynorbornene resin, or a modified resin of one of the foregoing resins or a hybrid resin containing at least one type of the foregoing resins. Among them, silicone resins or modified resins thereof are preferred because of their high heat resistance, high light resistance, and low volume shrinkage during solidification. A ceramic or glass material may be used to form the light-transmissive member 19, as an alternative to a resin material.

The light-transmissive member 19 may contain a diffusing agent, a fluorescent substance or the like. The diffusing agent is a material for diffusing light. The diffusing agent in the light-transmissive member lowers the directivity of light emitted from the light emitting element 17 or increases the view angle. Examples of the diffusing agent include silica, alumina, and titanium oxide.

The fluorescent substance converts light emitted from the light emitting element 17 so as to change the cromaticity of light that travels through the light-transmissive member 19 and goes out. Examples of the fluorescent substance include cerium-activated yttrium-aluminum garnet, nitrogen-containing calcium aluminosilicate activated by one or both of europium and chromium, europium-activated sialon, europium-activated silicate, manganese-activated potassium fluorosilicate.

Operation of Light Emitting Device

Hereinbelow, a description is given of the operation of the light emitting device.

In activating the light emitting device 10, a current is supplied from an external power supply to the light emitting element 17 via the reflective film 11, causing the light emitting element 17 to emit light. A portion of the light emitted from the light emitting element 17 that travels upward is extracted out from an upper side of the light emitting device 10. A portion of the light emitted from the light emitting element 17 that travels downward or in a lateral direction is reflected or scattered by a portion of the dielectric multilayered film 16 located on the upper surfaces of the reflective films 11 or portions of the dielectric multilayered film 16 located on the surfaces of the side walls constituted by the resin mold body 14*a*. The reflected or scattered light is extracted out from the upper side of the light emitting device 10. When the light emitting device 10 is in operation, because the light emitting device 10 has high adhesion between the reflective films 11 and the dielectric multilayered film 16, peeling-off is not likely to occur in the dielectric multilayered film 16. The dielectric multilayered film 16 is located on the inner surfaces of the recess 50 of the light emitting device 10 and thus efficiently reflects the light from the light emitting element 17 and the phosphor, resulting in an increase of the emission efficiency.

Method for Manufacturing Base and Light Emitting Device

Figure 4:
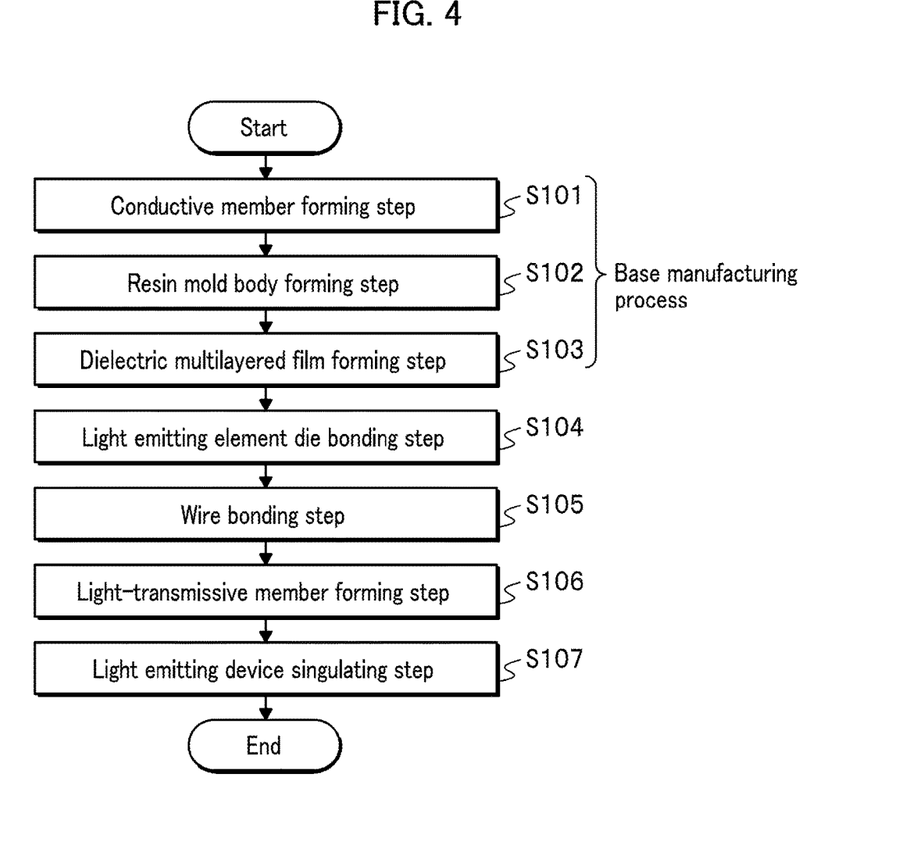
FIG. 4 is a flow chart illustrating a method for manufacturing the light emitting device according to the embodiment.

Next, a description is given of an example of a method for manufacturing the base and light emitting device according to an embodiment of the present invention, with reference to FIGS. 1A, 1B, 2A, 2B, and 4. FIG. 4 is a flow chart illustrating a method for manufacturing the light emitting device according to the embodiment. It is to be noted that the base in the embodiment is manufactured in a base manufacturing process in the method for manufacturing the light emitting device.

A method for manufacturing base 15 includes, in order, a conductive member forming step S101, a resin mold body forming step S102, and a dielectric multilayered film forming step S103. These steps constitute the base manufacturing process.

The method for manufacturing a light emitting device 10 includes, in order, the conductive member forming step S101, the resin mold body forming step S102, the dielectric multilayered film forming step S103, a light emitting element die bonding step S104, a wire bonding step S105, a light-transmissive member forming step S106, and a light emitting device singulating step S107.

Each of these steps is described below. Note that details of members of the base 15 and the light emitting device 10 are described above and thus duplicative descriptions of them are omitted as appropriate.

Base Manufacturing Process

The base manufacturing process is a process for manufacturing a base 15 having a recess 50 in which a light emitting element 17 is to be housed.

In the base manufacturing process, one single base 15 may be produced individually or an aggregate in which a plurality of bases 15 are contiguously arranged may be produced. The aggregate is structured in a matrix pattern with a predetermined number of rows and columns and predetermined spacing in the rows and columns.

Conductive Member Forming Step

The conductive member forming step S101 forms reflective films 11 on base members 12 to make conductive members 13.

In the conductive member forming step S101, a plate-like lead frame having base members 12*a* and base members 12*b* is formed such that the base members 12*a* and the base members 12*b* each have ends that are each contiguous with an end of another base member 12*a* or 12*b*. The lead frame may be formed by a conventionally known method, such as pressing or etching a metal plate. In the case in which wiring substrates are used as the base members 12*a* and 12*b*, those wiring substrates may also be prepared with a conventionally known method.

Next, reflective films 11 containing silver as a major component and containing an oxide 120 are formed on the surfaces of the base members 12. The reflective films 11 may be formed by, for example, electroplating, electroless plating, sputtering, or vapor deposition. Specifically, when using electroplating or electroless plating, it is possible to form reflective films 11 having an oxide 120 dispersed therethroughout by using electrolyte solution containing the oxide 120. Other conditions and procedures of the electroplating or electroless plating may follow known conditions and procedures.

When using sputtering or vapor deposition, the reflective films 11 may be formed by simultaneous sputtering using a silver target (including pure silver target) and an oxide target, sputtering using an alloy target containing silver and an oxide, or vapor deposition using an alloy containing silver and an oxide 120 as the deposition material. These sputtering methods and vapor deposition method are capable of forming reflective films 11 having the oxide 120 dispersed therethroughout.

The alloy used for the alloy target or the deposition material contains silver as a major component and contains the oxide 120. Here, nanoscale particles of the oxide 120 are dispersed in the silver alloy. An alternative to the vapor deposition using an alloy as the deposition material to form the reflective films 11 is to vapor-deposit a deposition material composed of silver (including pure silver) and a deposition material composed of the oxide 120 at the same time.

Other conditions and procedures of the sputtering methods and vapor deposition method may follow known conditions and procedures.

Resin Mold Body Forming Step

The resin mold body forming step S102 forms resin mold bodies 14*a* and 14*b*. The resin mold body 14*a* constitutes side walls. The resin mold body 14*b* has portions located underneath lower surfaces of a pair of conductive members 13*a* and 13*b* and a portion located therebetween.

In the resin mold body forming step S102, resin is injected into a mold where the injected resin is hardened to form resin mold bodies 14 (14*a*, 14*b*). When a thermosetting resin such as an epoxy resin is injected as the resin, the mold is heated to heat the thermosetting resin for a predetermined time to cure the thermosetting resin. When a thermoplastic resin such as a polyamide resin is used, injection molding is used to form the resin mold bodies 14 (14a, 14b). When using injection molding, a thermoplastic resin is heated up to a high temperature to be melted, and then injected into a low temperature mold to be solidified by cooling.

Dielectric Multilayered Film Forming Step

The dielectric multilayered film forming step S103 forms a dielectric multilayered film 16 on the reflective films 11 and resin mold bodies 14, thereby forming the base 15. In the dielectric multilayered film forming step S103, the dielectric multilayered film 16 is formed on upper surfaces of the reflective films 11 and surfaces of the resin mold body 14a, with the exception that the dielectric multilayered film 16 is not formed in predetermined regions of the upper surfaces of the reflective films 11 to which wires 18 are to be connected.

The dielectric multilayered film 16 is formed by stacking dielectric materials on the upper surfaces of the reflective films 11 and the surfaces of the resin mold body 14a by sputtering or vapor deposition. The dielectric multilayered film 16 is formed by combining and alternately stacking dielectric materials having significantly different refractive indices from each other. For example, a combination of $SiO_2$ and $ZrO_2$ or a combination of $SiO_2$ and $Nb_2O_5$ may be used to form the dielectric multilayered film 16. Note that the predetermined regions in which the dielectric multilayered film 16 is not formed are formed by masking the predetermined region with a photoresist and using a lift-off process.

Light Emitting Element Die Bonding Step

The light emitting element die bonding step S104 mounts a light emitting element 17 on the base 15. In the light emitting element die bonding step S104, the light emitting element 17 is mounted via the dielectric multilayered film 16 on the upper surface of the reflective film 11a on the bottom surface of the recess 50 with an adhesive 20.

Wire Bonding Step

The wire bonding step S105 connects wires 18 between the light emitting element 17 and the reflective films 11a, 11b of the conductive members 13a, 13b. In the wire bonding step S105, the light emitting element 17 is electrically connected to the conductive members 13a and 13b by connecting the light emitting element 17 and the reflective films 11a and 11b with respective wires 18. The method for connecting wires 18 is not limited. Any normally used method can be employed.

Light-Transmissive Member Forming Step

The light-transmissive member forming step S106 disposes a light-transmissive member 19 in the recess 50 in which the light emitting element 17 has been housed. In the light-transmissive member forming step S106, a material that becomes the light-transmissive member 19 is filled in the recess 50 of the base 15 so as to cover the light emitting element 17. Subsequently, the material is hardened by heating or light irradiation. As thus described, the light-transmissive member 19 covering the light emitting element 17 is formed.

Light Emitting Device Singulating Step

The light emitting device singulating step S107 is performed when an aggregate in which a plurality of bases 15 are contiguously arranged is prepared in the base manufacturing process. The light emitting device singulating step S107 singulates each of the bases 15 in the aggregate.

The singulation processing can be performed by a conventionally known method, such as a dicing technique for cutting the aggregate along lines dividing the aggregate by a blade or a scribing technique for breaking up the aggregate along the lines dividing the aggregate.

The singulation processing on the aggregate produces a plurality of light emitting devices 10.

Variant Embodiments

The light emitting device 10 has been described such that the reflective films 11 contain an oxide 120. However, the light emitting device 10 may contain a nitride or carbide instead of the oxide 120. Using a nitride or a carbide also achieves the same effect as when using an oxide 120. The particles to be contained in the reflective film 11 may be made of one selected from an oxide 120, a nitride, and a carbide, or may be composed of two or more of them. That is, the particles may be composed of at least one selected from an oxide 120, a nitride, or a carbide. The above descriptions of the oxide 120 also apply to cases in which particles formed of at least one material selected from an oxide 120, a nitride, and a carbide is used.

When using particles formed of the at least one material selected from an oxide 120, a nitride, and a carbide, the reflective films 11 may be formed by electroplating or electroless plating using electrolyte solution containing the at least one material. The reflective films 11 may be formed by simultaneous sputtering using a silver target (including pure silver target) and a target of the at least one material, sputtering using a target containing silver and the at least one material, or vapor deposition using a deposition material containing silver and the at least one material.

The light emitting device 10 has been described as having the light-transmissive member 19. However, the light emitting device 10 may be configured to not have the light-transmissive member 19. In the above-described light emitting device 10, the light emitting element is a face-up (FU) type element having a pair of positive and negative electrodes on the same surface (upper surface), and the pair of positive and negative electrodes are connected through wires 18 to the reflective films 11. Alternatively, the light emitting device may be configured such that the light emitting element has a lower surface on which one of a pair of positive and negative electrodes is located and has an upper surface opposite the lower surface on which the other of the pair of positive and negative electrodes is located, and that the electrode located on the lower surface is affixed via an electrically conductive adhesive to the corresponding reflective film 11 and the electrode located on the upper surface is connected through a wire 18 to the corresponding reflective film 11. Still alternatively, the light emitting device may be configured such that the light emitting element is a face-down (FD) type element having a lower surface on which a pair of positive and negative electrodes are located and connected through electrically conductive adhesives to the reflective films 11.

The light emitting device 10 has been described as having one light emitting element 17. However, a plurality of light emitting elements 17 may be mounted on one light emitting device 10. The plurality of light emitting elements 17 may be connected in series or in parallel.

The light emitting device 10 has been described such that the base 15 has the recess 50. However, the light emitting device 10 may be configured to have a base not having the recess 50. For example, the base may be a flat-plate base in which a base member, a reflective film, and a dielectric multilayered film are disposed in this order.

Example

Hereinbelow, a description is given of the examples according to the present invention. It should be understood that the present invention is not limited to the following examples.

Figure 5:
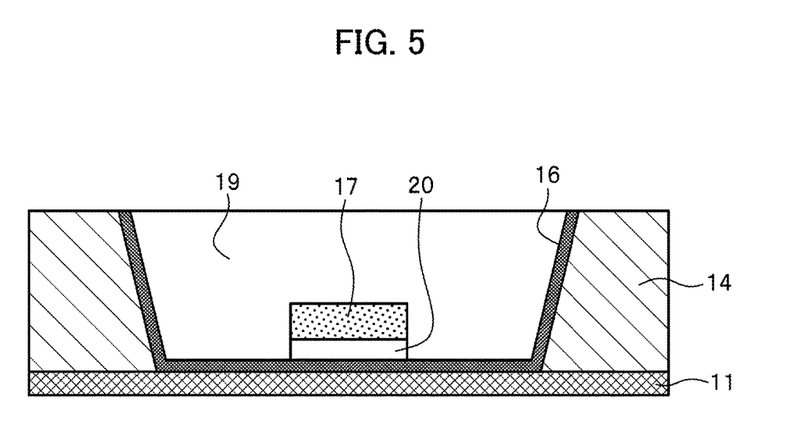
FIG. 5 shows a model for optical simulation of examples of the present disclosure and a comparative example.

FIG. 5 shows a model of the light emitting device for optical simulation of examples and a comparative example.

Simulated Example 1

As Simulated Example 1, an optical simulation was conducted using commercially available software Light-Tools® by Synopsys Corporation, version 8.4.0, to compute the emission power and luminous flux. It was assumed that: the light emitting element 17 was a nitride-based semiconductor; the light emitting element 17 had dimensions of 650 μm by 650 μm and a thickness of 150 μm; the light emitting element 17 had an emission peak wavelength of 450 nm; the light-transmissive member 19 was composed of a phenyl silicone; the adhesive 20 of the light emitting element 17 was composed of a dimethyl silicone; and the phosphor was YAG:Ce. The emission power was computed on the assumption that the phosphor concentration was zero; the luminous flux was computed for three phosphor concentrations of $3.50 \times 10^5/\text{mm}^3$, $4.25 \times 10^5/\text{mm}^3$, and $5.00 \times 10^5/\text{mm}^3$. It was assumed that the dielectric multilayered film 16 had three pairs of $SiO_2$ and $Nb_2O_5$ films stacked from the reflective film 11 side or from the resin mold bodies 14 side; the $SiO_2$ films each had a thickness of 46 nm; the $Nb_2O_5$ films each had a thickness of 77 nm; and the target wavelength of the dielectric multilayered film 16 was 450 nm.

In the result of the later-described evaluation of interface reflectance, a reflective film 11 to which an oxide was added had been shown to have the same level of reflectance of pure silver. Thus, the reflectance of pure silver was used as the reflectance of the reflective film 11 in the computation.

Table 1 shows the materials and film thicknesses of the dielectric multilayered films 16 used in the Simulated Examples 1 and 2.

TABLE 1

| Dielectric multilayered film* Film type | Simulated Comparative Example 1 Film thickness (nm) | Simulated Example 1 Film thickness (nm) | Simulated Example 2 Film thickness (nm) |
|---|---|---|---|
| $Nb_2O_5$ | 0 | 77 | 95 |
| $SiO_2$ | 0 | 46 | 59 |
| $Nb_2O_5$ | 0 | 77 | 95 |
| $SiO_2$ | 0 | 46 | 59 |
| $Nb_2O_5$ | 0 | 77 | 95 |
| $SiO_2$ | 0 | 46 | 59 |

*The films in the dielectric multilayered film were assumed to be successively stacked on the reflective film side or the resin mold body side, in order from the bottom row to the top row of the table.

Simulated Example 2 was configured in the same manner as Simulated Example 1 except that, in the dielectric multilayered film 16, the $SiO_2$ films each had a thickness of 59 nm and the $Nb_2O_5$ films each had a thickness of 95 nm; and that the target wavelength of the dielectric multilayered film 16 was 555 nm.

Simulated Comparative Example 1

Simulated Comparative Example 1 was configured in the same manner as Simulated Example 1 except that the light emitting device has no dielectric multilayered film 16.

Evaluation of Emission Power and Luminous Flux

Figure 6:
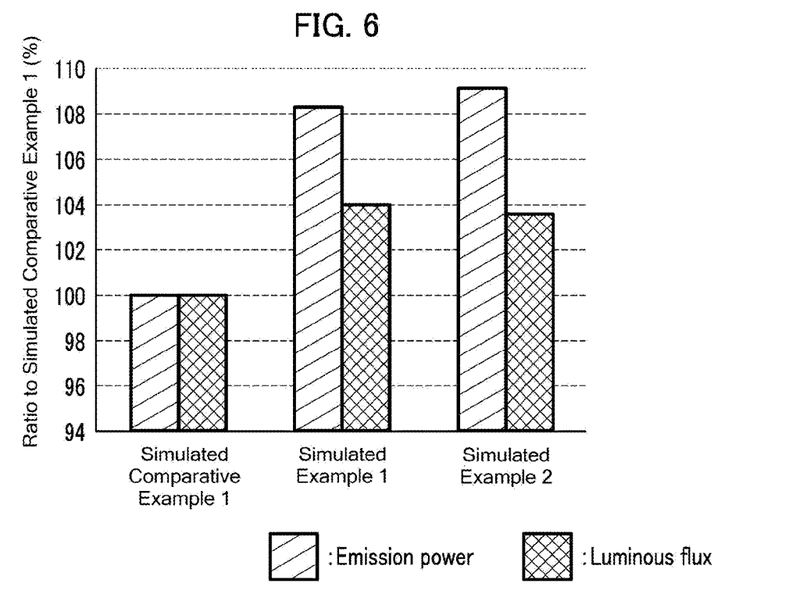
FIG. 6 is a graph showing comparison of the emission power and the luminous flux between the light emitting devices of the simulated examples and the simulated comparative example.
Figure 7:
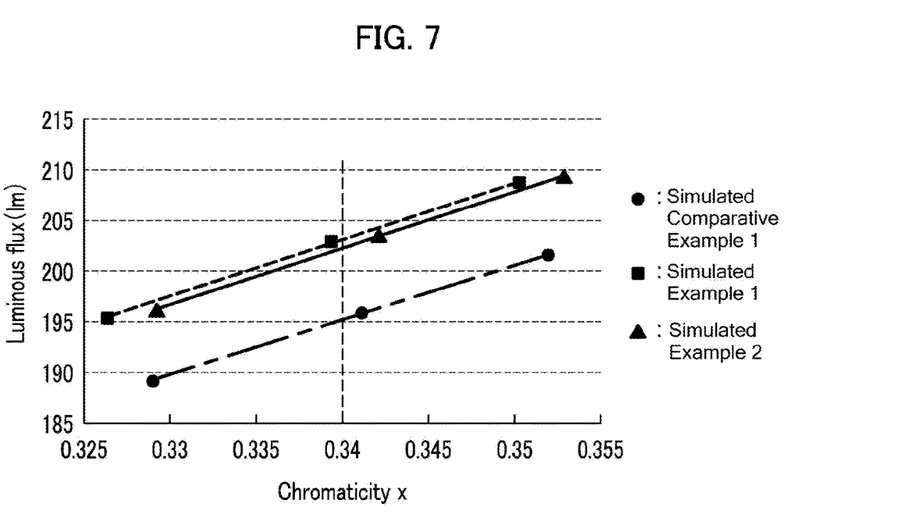
FIG. 7 is a graph showing the relation between the chromaticity x and the luminous flux of each of the simulated examples and the simulated comparative example.
Figure 8:
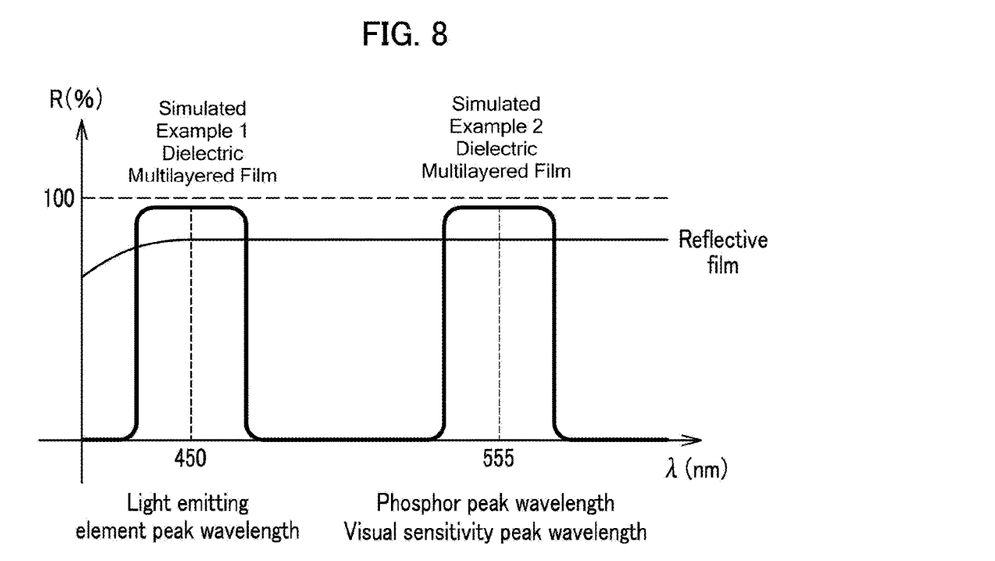
FIG. 8 is a schematic view illustrating the interface reflectance of the reflective film-dielectric multilayered film structure in each of the simulated examples and the simulated comparative example.

Simulated Example 1, Simulated Example 2, and Simulated Comparative Example 1 were evaluated as to their emission power and luminous flux. FIG. 6 is a graph showing comparison of the emission power and the luminous flux of the light emitting devices of Simulated Examples 1 and 2 and Simulated Comparative Example 1. FIG. 7 is a graph showing the relation between the chromaticity x and the luminous flux of each of Simulated Examples 1 and 2 and Simulated Comparative Example 1. FIG. 6 shows comparison of the emission power and the luminous flux at a chromaticity x of 0.34. FIG. 7 shows the relation between the chromaticity x and the luminous flux for each of Simulated Examples 1 and 2, and Simulated Comparative Example 1. FIG. 8 is a schematic view illustrating interface reflectances of the reflective films and dielectric multilayered films in Simulated Examples 1 and 2 and Simulated Comparative Example 1. Note that, in FIG. 8, the ordinate represents the interface reflectance R.

Simulated Examples 1 and 2 each had an emission power greater than that of Simulated Comparative Example 1 by about 8% to 9%, and had a luminous flux greater than that of Simulated Comparative Example 1 by about 4%. From these results, the use of the dielectric multilayered film 16 has been shown to increase the emission power and the luminous flux as intended.

The light of Simulated Example 1 had a chromaticity x smaller than those of Simulated Example 2 and Simulated Comparative Example 1, and thus had a color shift toward blue. For this reason, it is necessary to increase the amount of phosphor in Simulated Example 1 to obtain the same level of chromaticity x as Simulated Comparative Example 1. In contrast, the light of Simulated Example 2 had the same level of chromaticity x as that of Simulated Comparative Example 1. Thus, Simulated Example 2 is advantageous in cost in that no increase in the amount of phosphor is necessary.

As to the above described result, Simulated Example 1 had a color shift toward blue because the light from the light emitting element was selectively reflected, whereas Simulated Example 2 had no color shift toward blue because the selective reflection of the light from the light emitting element was avoided in Simulated Example 2. In addition, Simulated Example 2 utilizes the peak in the visual sensitivity and thus exhibits almost no decrease in the luminous flux.

Evaluation of Interface Reflectance

Figure 9:
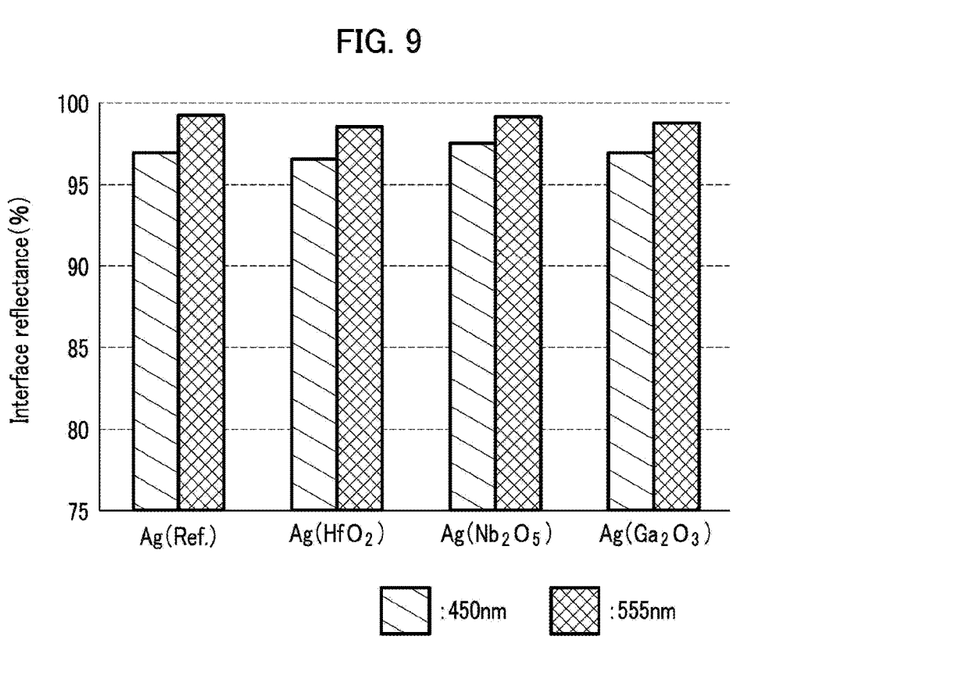
FIG. 9 is a graph showing interface reflectances of reflective films in examples of the present embodiment and a comparative example.

For each of a reflective film containing $HfO_2$, a reflective film containing $Nb_2O_5$, a reflective film containing $Ga_2O_3$, and a reflective film made of pure silver, the reflectance of the interface between the reflective film and the dielectric multilayered film was investigated. FIG. 9 is a graph showing interface reflectances of reflective films in examples of the present embodiment and a comparative example.

Specifically, each of the reflective films were formed on a commercially available glass slide, and the interface reflectance of the reflective film through the glass slide was determined using a U-3010 spectrophotometer (ROM Ver. 2520 10) manufactured by Hitachi High-Technologies Corporation. Addition of an oxide to a silver film was performed by simultaneous sputtering using a pure silver target and an oxide target. The content of the oxide in each of the silver films was determined by ICP-AES analysis. Specifically, the content of $HfO_2$ was determined to be 0.24% by mass; $Nb_2O_5$, 0.03% by mass; and $Ga_2O_3$, 0.07% by mass.

The reflectances of the $HfO_2$-added silver film, the $Nb_2O_5$-added silver film, and the $Ga_2O_3$-added silver film were almost the same level as that of the pure silver film. This result shows that it is possible to maintain the same level of reflectance of the pure silver film even when each of the above oxides is added to the pure silver film with the above described content.

Evaluation of Peeling-Off Rate

For each of a reflective film containing $HfO_2$, a reflective film containing $Nb_2O_5$, a reflective film containing $Ga_2O_3$, and a reflective film made of pure silver, a peel-off test was conducted by means of a tape to investigate the peel-off rate of the interface between the reflective film and a dielectric multilayered film. Specifically, an $SiO_2$ film, which can be used as a layer in a dielectric multilayered film, was formed on a sapphire substrate as a foundation film without patterns. After that, a photolithography process was performed to form a reflective film on the $SiO_2$ film and a lift-off process was performed to form an electrode pattern of a predetermined structure in the reflective film. The electrode pattern had 10,000 pattern units. Next, a UV sheet was affixed to the reflective film in which the electrode pattern had been formed, and then the UV sheet was peeled off. Then, the number of pattern units that were peeled off from the $SiO_2$ film was counted to compute the peel-off rate.

Table 2 shows, for each of the reflective films, the type of the foundation film, the structure and thickness of the reflective film, and the peel-off rate observed in the peel-off test.

Note that the method for adding an oxide to a silver film and the content of the added oxide were as the same as those in the above-described evaluation of interface reflectance.

TABLE 2

| Foundation film Film type | Reflective film Structure | Film thickness (Å)* | Peel-off test Peel-off rate (%) |
|---|---|---|---|
| $SiO_2$ | Ag/Ni/Ti/Pt | 1k/3k/1k/1k | 90 |
| $SiO_2$ | Ag($HfO_2$)/Ni/Ti/Pt | 1k/3k/1k/1k | 0.03 |
| $SiO_2$ | Ag($Nb_2O_5$)/Ni/Ti/Pt | 1k/3k/1k/1k | 0.02 |
| $SiO_2$ | Ag($Ga_2O_3$)/Ni/Ti/Pt | 1k/3k/1k/1k | 0.03 |

*1k = 1000

As shown in Table 2, the reflective films containing an oxide had almost no peel-off compared to the reflective film made of pure silver.

The light emitting devices of the present invention are applicable to backlight light sources of liquid crystal displays, various lighting equipment, large displays, various display apparatuses such as advertisement display apparatuses and guideboards, as well as image capturing devices or image readers of digital camcorders, fax machines, copiers, and scanners, and projectors and the like.

What is claimed is:

1. A semiconductor device comprising:
   a base comprising:
      a base member,
      a reflective film located above the base member, the reflective film containing silver as a major component and containing particles formed of at least one material selected from the group consisting of an oxide, a nitride, and a carbide, and
      a distributed Bragg reflector film, a portion of which contacts an upper surface of the reflective film; and
   a semiconductor element disposed on the base.

2. The semiconductor device according to claim 1, wherein a content of the particles in the reflective film is at least 0.01% by mass and at most 5% by mass with respect to a total mass of the reflective film.

3. The semiconductor device according to claim 1, wherein the particles are in contact with the distributed Bragg reflector film or distributed near a surface of the reflective film closer to the distributed Bragg reflector film.

4. The semiconductor device according to claim 1, wherein the particles are dispersed throughout the reflective film.

5. The semiconductor device according to claim 1, wherein the particles are unevenly distributed and concentrated at or near an upper surface of the reflective film.

6. The semiconductor device according to claim 1, wherein the particles contained in the reflective film are formed of at least one material selected from the group consisting of $Ga_2O_3$, $Nb_2O_5$, and $HfO_2$.

7. The semiconductor device according to claim 1, wherein:
   the distributed Bragg reflector film comprises two or more types of films each containing an oxide or nitride of at least one element selected from the group consisting of Si, Ti, Zr, Nb, Ta, and Al as a major component, and
   the two or more types of films have different refractive indices from one another.

8. The semiconductor device according to claim 1, wherein the semiconductor element is a semiconductor light emitting element.

9. A base comprising:
   a base member;
   a reflective film located above the base member, the reflective film containing silver as a major component and containing particles formed of at least one material selected from the group consisting of an oxide, a nitride, and a carbide; and
   a distributed Bragg reflector film, a portion of which contacts an upper surface of the reflective film.

10. A method for manufacturing a semiconductor device, the method comprising steps of:
    forming a base, which comprises:
       forming a reflective film on a base member, the reflective film containing silver as a major component and containing particles formed of at least one material selected from the group consisting of an oxide, a nitride, and a carbide, and
       forming a distributed Bragg reflector film, a portion of which contacts an upper surface of the reflective film, and
    mounting a semiconductor element on the base.

11. The method according to claim 10, wherein the step of forming the reflective film comprises forming the reflective film by electroplating, electroless plating, sputtering, or vapor deposition.

12. The method according to claim 10, wherein the step of forming the reflective film comprises:
    simultaneous sputtering using a silver target and a target of said at least one material selected from the group consisting of an oxide, a nitride, and a carbide;
    sputtering using an alloy target containing silver and said at least one material selected from the group consisting of an oxide, a nitride, and a carbide; or
    vapor deposition using an alloy containing silver and said at least one material selected from the group consisting of an oxide, a nitride, and a carbide as a deposition material.

13. The method according to claim 10, wherein the step of forming a reflective film comprises incorporating the particles into the reflective film such that the particles are exposed at an upper surface of the reflective film or the particles are distributed near the upper surface of the reflective film.

14. The method according to claim 10, wherein the particles are dispersed throughout the reflective film.

15. The method according to claim 10, wherein the particles are unevenly distributed and concentrated at or near an upper surface of the reflective film.

16. The method according to claim 10, wherein a content of the particles in the reflective film is at least 0.01% by mass and at most 5% by mass with respect to a total mass of the reflective film.

17. The method according to claim 10, wherein the particles contained in the reflective film are formed of at least one material selected from the group consisting of $Ga_2O_3$, $Nb_2O_5$, and $HfO_2$.

18. The method according to claim 10, wherein:
the distributed Bragg reflector film is made by stacking two or more types of films each containing an oxide or nitride of at least one element selected from the group consisting of Si, Ti, Zr, Nb, Ta, and Al as a major component, and
the two or more types of films have different refractive indices from one another.

19. The method according to claim 10, wherein the semiconductor element is a semiconductor light emitting element.

20. A method for manufacturing a base, the method comprising the steps of:
forming a reflective film on a base member, the reflective film containing silver as a major component and containing particles formed of at least one material selected from the group consisting of an oxide, a nitride, and a carbide, and
forming a distributed Bragg reflector film, a portion of which contacts an upper surface of the reflective film.

21. The semiconductor device according to claim 1, further comprising:
an adhesive disposed on the base,
wherein the semiconductor element is disposed on the base via the adhesive.

22. The method according to claim 10, further comprising:
before the step of mounting the semiconductor element on the base, forming an adhesive on the base,
wherein, in the step of mounting the semiconductor element on the base, the semiconductor element is mounted on the base via the adhesive.

23. The semiconductor device according to claim 1, wherein, in a plan view of the semiconductor device, a portion of an upper surface of the distributed Bragg reflector film is located outside an area of the semiconductor element.

24. The method according to claim 10, wherein, in a plan view of the semiconductor device, a portion of an upper surface of the distributed Bragg reflector film is located outside an area of the semiconductor element.

* * * * *